(12) United States Patent
Harvey et al.

(10) Patent No.: US 6,954,069 B2
(45) Date of Patent: Oct. 11, 2005

(54) OBTAINING MRI IMAGES USING SUB-SAMPLING IN A VERTICAL FIELD MRI APPARATUS

(75) Inventors: Paul Royston Harvey, Eindhoven (NL); Marinus Johannes Adrianus Maria van Helvoort, Eindhoven (NL); Johan Samuel van den Brink, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 619 days.

(21) Appl. No.: 09/990,209

(22) Filed: Nov. 21, 2001

(65) Prior Publication Data

US 2002/0089329 A1 Jul. 11, 2002

(30) Foreign Application Priority Data

Nov. 24, 2000 (EP) .......................................... 00125776

(51) Int. Cl.[7] .............................................. G01V 3/00
(52) U.S. Cl. ...................................... 324/318; 324/322
(58) Field of Search ................................ 324/318, 322, 324/307, 309, 306, 300; 600/421, 422

(56) References Cited

U.S. PATENT DOCUMENTS 5,951,474 A * 9/1999 Matsunaga et al. ......... 600/422

6,215,307 B1 * 4/2001 Sementchenko ............ 324/318
6,249,121 B1 * 6/2001 Boskamp et al. ........... 324/318
6,396,269 B1 * 5/2002 Hajnal et al. ............... 324/307

FOREIGN PATENT DOCUMENTS

| EP | 1014102 A2 | 6/2000 | ....... G01R/33/3415 |
| WO | WO9821600 | 5/1998 | ....... G01R/33/3415 |

OTHER PUBLICATIONS

ISMRM Book of Abstracts 1999, p. 736, "Vertical Field Open RF Body Coils".

"SENSE: Sensitivity Encoding for Fast MRI", Magnetic Resonance in Medicine 42:952–962 (1999).

* cited by examiner

Primary Examiner—Louis Arana (57) ABSTRACT

The invention relates to a method for obtaining MRI images in a vertical main field while using a sub-sampling scheme like SENSE. The invention proposes a number of coil arrangements such that the advantages of SENSE (high speed acquisition) and vertical field (open view for the patient so as to avoid sensations of fear and claustrophobia) are combined. The coil arrangements preferably include butterfly coils and are arranged in such a way that they offer access to the patient and also allow the patient to be moved into and out of the imaging volume without interference by the RF coils.

16 Claims, 6 Drawing Sheets

OBTAINING MRI IMAGES USING SUB-SAMPLING IN A VERTICAL FIELD MRI APPARATUS

The invention relates to a method for obtaining MRI images of an object to be examined in an imaging volume of an MRI apparatus, the object having a longitudinal axis in the y-direction, in which method:
- a homogeneous magnetic field is provided in the z-direction in the imaging volume of the apparatus
- the object to be examined is positioned in the imaging volume such that its longitudinal axis extends transversely of the z-direction,
- an RF excitation pulse is generated in the imaging volume of the apparatus,
- magnetic resonance signals which are due to the RF excitation pulse are acquired by means of at least one RF receiving coil.

Such a method is known from an article in the ISMRM Book of Abstracts 1999, page 736, "Vertical Field Open RF Body Coils". This article describes a Vertical Field Open MRI system in which a vertical homogeneous magnetic main field is generated between two parallel magnet poles having horizontal pole faces. The direction of the homogeneous field (the $B_0$ field) is indicated as the z-direction. During examination an object to be examined (being a patient in the case of medical MRI apparatus) is arranged horizontally between the pole faces. The longitudinal direction of the patient (head-to-feet) is indicated as the y-direction and the direction perpendicular to the z-direction and the y-direction is indicated as the x-direction. According to the well known MRI imaging process a radio frequency (RF) excitation pulse is produced in the imaging volume of the apparatus, which pulse generates magnetization of the material in the imaging volume. After the RF excitation has been removed, the magnetization vector precesses about the $B_0$ field lines at the Larmor frequency, thus causing RF magnetic resonance signals that can be received by RF receiving coils.

Generally speaking, the RF magnetic resonance signals that are received by the receiving coils are further processed so as to reconstruct the desired MRI image. One step in said processing is the sampling of the received signals, this step being the limiting factor in the speed of the process of obtaining the MRI image. In order to enhance said speed, it is known to apply sub-sampling of the received signals in the so-called k-space. An example of such a sub-sampling technique is known by the name of SENSE. Said article in the ISMRM Book of Abstracts utilizes a butterfly coil in combination with a vertical magnetic field.

Combining a vertical homogeneous magnetic main field in an MRI system with said sub-sampling techniques provides the advantages of both kinds of systems, that is, avoiding the sensations of claustrophobia for the patient by offering an open (vertical field) system and obtaining a high speed imaging process by sub-sampling.

The invention has for its object to provide an MRI imaging method employing an RF receive coil arrangement that makes said high speed imaging by sub-sampling possible in a vertical field MRI apparatus. To achieve this, the method according to the invention is characterized in that
- the magnetic resonance signals which are due to the RF excitation pulse are acquired in a sub-sampled fashion by means of a set of at least two RF receiving coils,
- a magnetic resonance image is derived from the sub-sampled magnetic resonance signals and on the basis of previously determined spatial coil sensitivity profiles of each RF coil in the set of RF receiving coils, said spatial coil sensitivity profiles being mutually independent, and
- the planes of the at least two receiving coils extend substantially parallel to one another and to the z-direction.

The invention is based on the application of a sub-sampling technique that is known per se in a vertical field MRI apparatus. Such sub-sampling techniques are known per se by the names of SENSE or SMASH and address the problem of acquiring MRI-signals at a high speed.

The time required for the acquisition of the MRI-signals is reduced by employing sub-sampling of the MR-signals. Such sub-sampling involves a reduction in k-space of the number of sampled points; this reduction can be achieved in various ways. The MR signals are picked-up through signal channels pertaining to several receiver coils, preferably being surface coils. Acquisition through several signal channels enables parallel acquisition of signals so as to further reduce the signal acquisition time. Owing to the sub-sampling, sampled data contain contributions from several positions in the object being imaged. The MR image is reconstructed from the sub-sampled MR-signals while using a sensitivity profile associated with the signal channels. The sensitivity profile is, for example, the spatial sensitivity profile of the receiver antennae such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, that is, the smallest wavenumber, involved is the field-of-view (FOV) of the magnetic resonance image. The resolution is determined by the ratio of the field-of-view to the number of samples.

The sub-sampling can be achieved in that respective receiver antennae acquire MR signals such that their resolution in k-space is coarser than required for the resolution of the magnetic resonance image. The smallest wavenumber sampled, that is, the minimum step size in k-space, is increased while the largest wavenumber sampled is maintained. Hence, the image resolution remains the same when applying sub-sampling, while the minimum k-space step increases, that is, the FOV decreases. The sub-sampling can also be achieved by reduction of the sample density in k-space, for instance by skipping lines in the scanning of k-space so that lines in k-space are scanned which are more widely separated than required for the resolution of the magnetic resonance image. The sub-sampling can also be achieved by reducing the field-of-view while maintaining the largest k-value so that the number of sampled points is reduced accordingly. Owing to the reduced field-of-view, sampled data contain contributions from several positions in the object being imaged.

Notably when receiver coil images are reconstructed from sub-sampled MR-signals from respective receiver coils, such receiver coil images contain aliasing artefacts that are caused by the reduced FOV. The contributions in individual positions of the receiver coil images from different positions in the image are disentangled from the receiver coil images and the sensitivity profiles and the magnetic resonance image is reconstructed. This MR-imaging method is known as such under the acronym SENSE-method. This SENSE-method is discussed in more detail in an article entitled "SENSE: Sensitivity Encoding for Fast MRI", Magnetic Resonance in Medicine 42: 952–962 (1999).

Sub-sampling may also be carried out spatially. In that case the spatial resolution of the MR-signals is less than the resolution of the MR image and MR-signals corresponding to full resolution of the MR image are formed on the basis of the sensitivity profile. Spatial sub-sampling is in particular achieved in that MR signals in separate signal channels, for example, from individual receiver coils, form a combination of contributions from several portions of the object. Such portions are for example simultaneously excited slices. The MR signals in each signal channel often form linear combinations of contributions from several portions, for example, slices. This linear combination involves the sensitivity profile associated with the signal channels, that is, of the receiver coils. Thus, the MR signals of the respective signal channels and the MR signals of respective portions (slices) are related by a sensitivity matrix which represents weights of the contribution of several portions of the object in the respective signal channels that are due to the sensitivity profile. MR signals pertaining to respective portions of the object are derived by inversion of the sensitivity matrix. In particular MR-signals are derived from respective slices and magnetic resonance images of these slices are reconstructed.

In order to apply the sub-sampling technique it is thus necessary to provide at least two RF receiving coils whose spatial coil sensitivity profiles are known. In order to enable reconstruction of the MR image, these profiles should be mutually independent.

According to the invention it has been found that it is possible to apply a sub-sample technique in a vertical field MRI apparatus by providing at least RF receiving coils whose planes are substantially parallel to one another and to the z-direction. This arrangement of RF coils enables acquisition of the required RF signals without impeding patient access to the imaging volume.

In a preferred embodiment the receiving coils are embodied as butterfly coils. Butterfly coils are known per se. As is well known such coils are sensitive to magnetic fields that are parallel to the coil plane, making these coils particularly suitable for use in vertical field MRI apparatus. The name "butterfly coil" is derived from the frequently used shape of the coil windings. It should, however, be noted that within the context of the invention any RF receiving coil that is sensitive to RF fields parallel to its coil plane is considered to be a "butterfly coil".

In a further preferred embodiment yet the butterfly coils are sensitive to an RF field component transversely of the z-direction. The coils can then be positioned over and under the patient, thus leaving access to the patient possible and at the same time offering the possibility of moving the patient in and out of the imaging volume without hindering him or her with the RF coils.

Further embodiments are disclosed in the dependent claims. These embodiments and their technical effects will be described with reference to the figures.

The invention and its advantages will be explained in detail with reference to the drawing in which identical reference numerals refer to the same elements. Therein.

Figure 1:
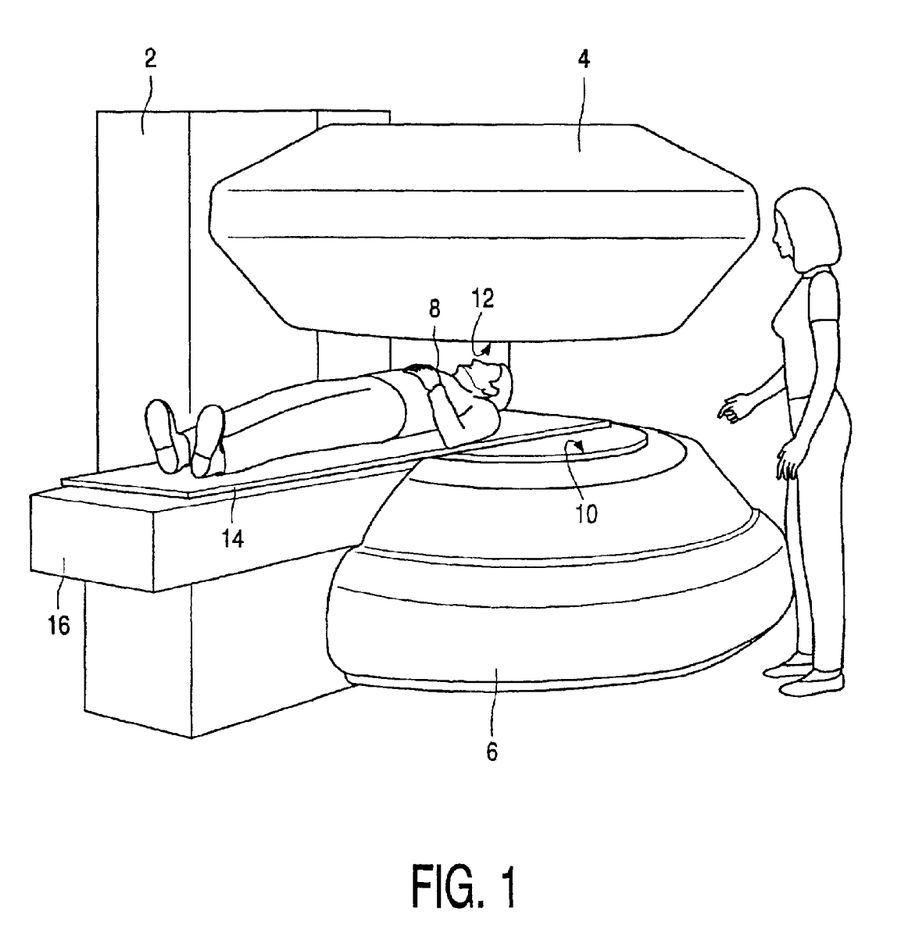
FIG. 1 shows an overview of a known vertical field apparatus for obtaining MRI images.

FIG. 1 shows a known vertical field apparatus for obtaining MRI images. A co-ordinate system with the various co-ordinates is shown above the apparatus so as to indicate the various co-ordinate directions in relation to the apparatus. The apparatus is provided with a stand 2 for carrying the lower magnet pole 4 and the upper magnet pole 6. It is to be noted that the expression "magnet pole" means the aggregate of corresponding coils for generating the main magnetic field in the z-direction without the necessity (but maintaining the possibility) to provide an iron circuit for conducting the magnetic flux from one pole to the other. Between the magnet poles there is a space for positioning the patient 8 to be examined. The patient is arranged on a table top 14 that in its turn is carried by a support that is part of the stand 2 such that the patient 8 can be positioned in the required position and orientation (in the y-direction) between the magnet poles 4 and 6. The longitudinal direction of the patient (head-to-feet) is the y-direction.

In customary MRI apparatus the space for receiving the patient to be examined is tunnel shaped, its diameter being of the order of magnitude of 60 cm; this causes sensations of fear and claustrophobia for many patients, in particular for children. It is an advantage of the arrangement of magnet poles according to FIG. 1 that during positioning in such apparatus the patient keeps an open view of the scenery, thus avoiding said sensations completely or in part.

At the side of the patient the magnet poles are confined by pole surfaces 10 and 12 which are constituted by the encapsulation cover of the cryo containers in which the superconducting magnet coils reside. The distance between the pole surfaces is chosen to be such that said unpleasant sensations of the patient are counteracted, but not so large that the production of the magnet poles becomes too costly. In practice a distance of between 50 and 60 cm appears to be a suitable value.

Figure 2A:
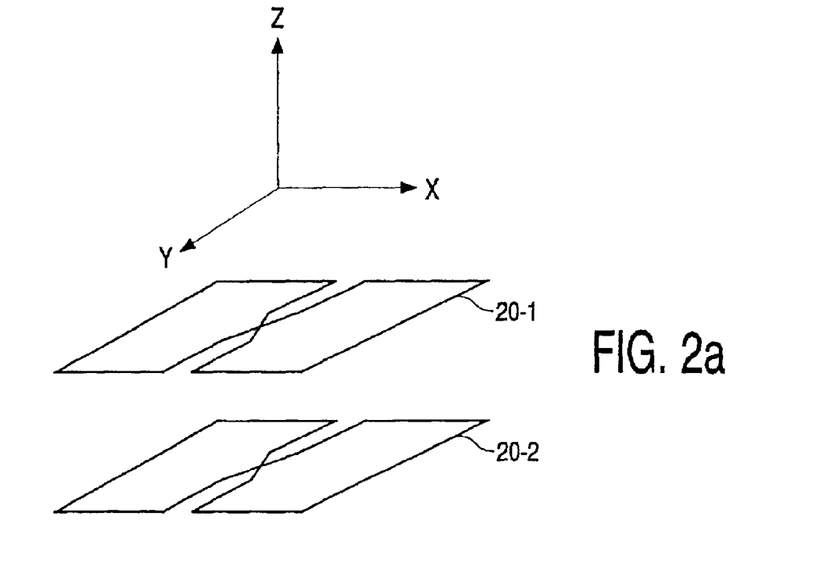
FIGS. 2a, 2b and 2c show RF butterfly coil arrangements according to a preferred embodiment of the invention.
Figure 2B:
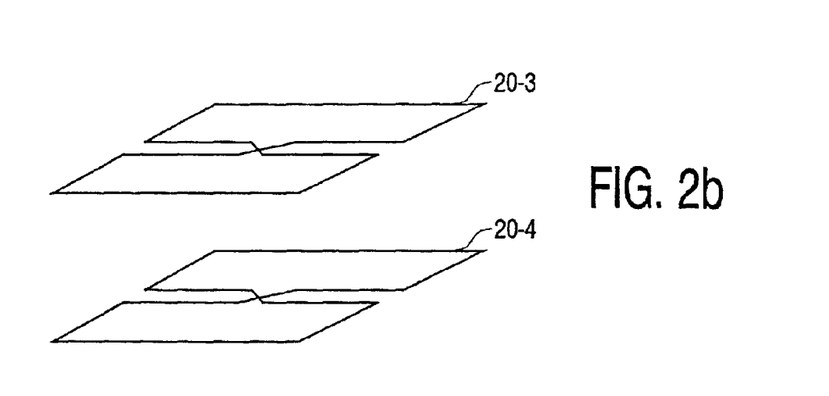
Figure 2C:
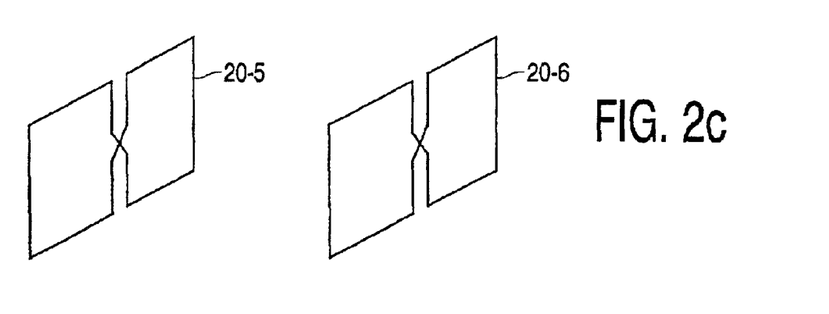

FIGS. 2a, 2b and 2c each show an RF butterfly coil arrangement according to a preferred embodiment of the invention. These figures show some of the basic two coil (two channel) arrangements that are compatible with a vertical field magnet. A co-ordinate system showing the various co-ordinates is shown above these figures so as to indicate the various co-ordinate directions in relation to the coils.

FIG. 2a shows two butterfly coils 20-1 and 20-2 which can be placed anterior and posterior to the patient. In this case the coils are most sensitive to the x-component of transverse magnetization.

FIG. 2b shows the same arrangement but rotated 90 degrees around the $B_0$-axis (z-axis) so as to provide most sensitivity to the $M_y$ component. The fact that both coil elements 20-3 and 20-4, anterior and posterior, see the same imaging volume but with oppositely facing sensitivity profiles, makes them ideal for sub-sampling applications like SENSE, offering a scan time reduction factor of up to 2.

FIG. 2c shows another possibility for using butterfly coils 20-5 and 20-6 left and right (L/R configuration) of the patient so as to provide sensitivity to the y-component of transverse magnetization. Again the opposing sensitivity profiles of the two coils provide and ideal configuration for SENSE applications with a scan time reduction factor of up to 2. This configuration provides sensitivity to the y-component of the RF-field also.

Figure 3:
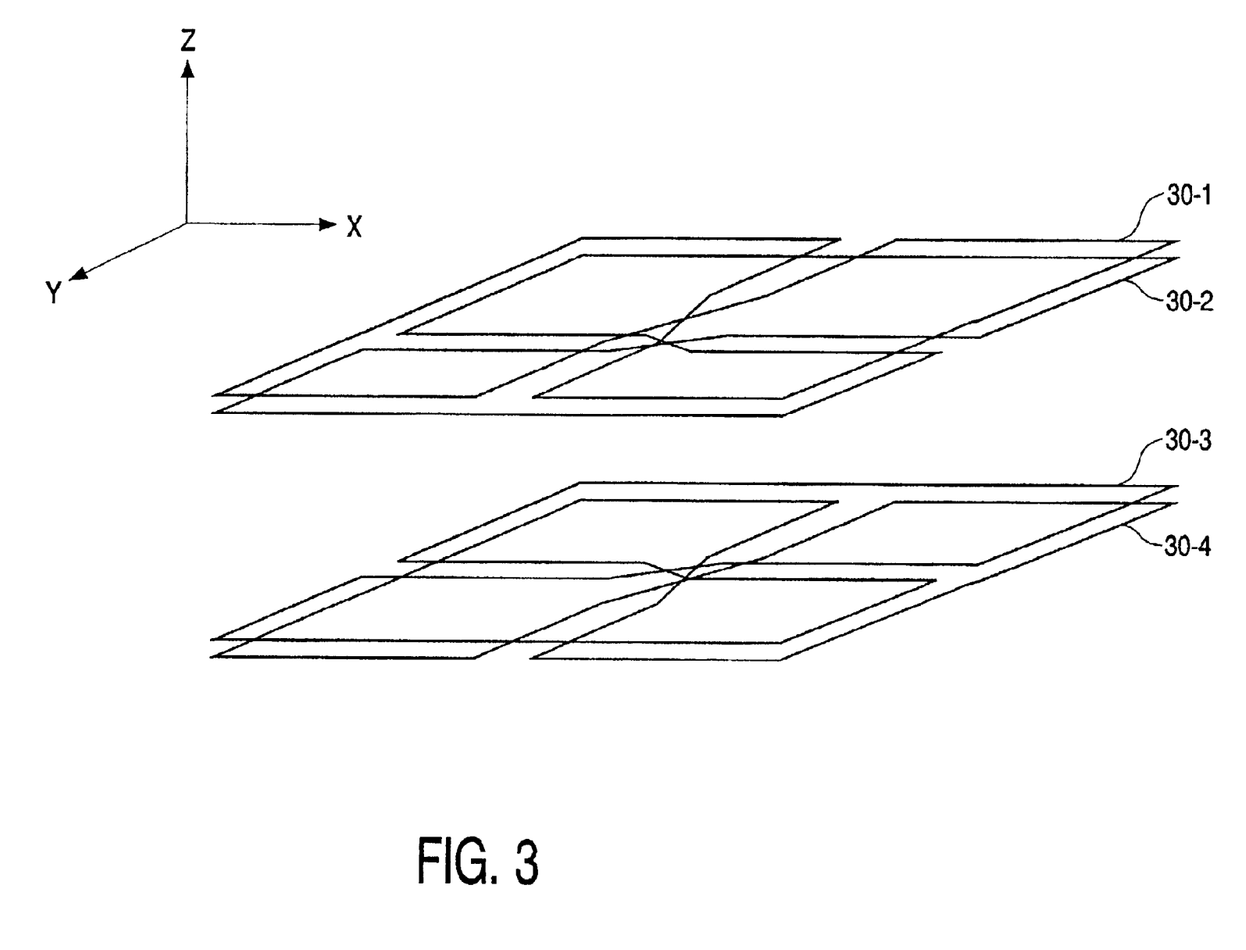
FIG. 3 shows an RF butterfly coil arrangement having multiple sensitivity directions according to the invention.

FIG. 3 shows a further embodiment that combines 4 (linear) butterfly coil elements 30-1, 30-2. 30-3 and 30-4 so as to form 2-channel quadrature coil arrangements for a reduction factor of 2 in SENSE. Alternatively, each of the 4 linear elements can be otherwise distributed so as to provide 4 channel linear coil arrangements that allow reduction factor of 2 in SENSE along two orthogonal spatial axes, thereby enabling a total SENSE reduction factor of 4. The arrangement also has the advantage that the patient is accessible from the y-direction as well as from the x-direction. There are no RF-coils that form an obstruction for the patient being positioned in the imaging volume.

Figure 4A:
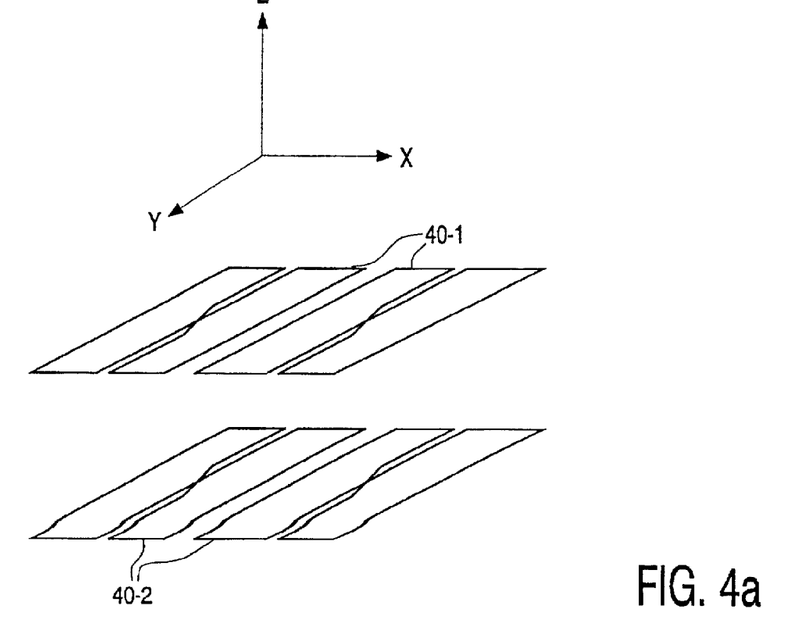
FIGS. 4a, 4b and 4c show RF butterfly coil arrangements according to another embodiment of the invention.
Figure 4B:
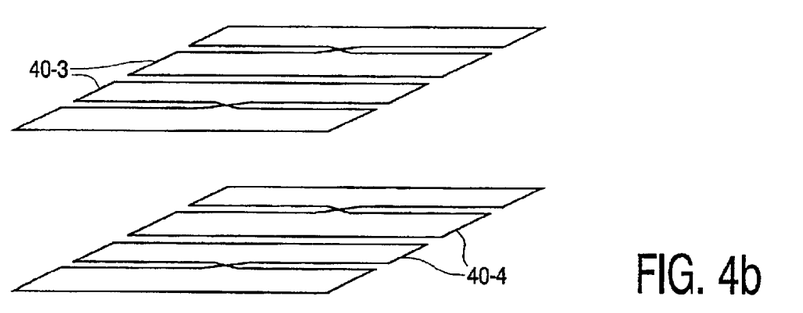
Figure 4C:
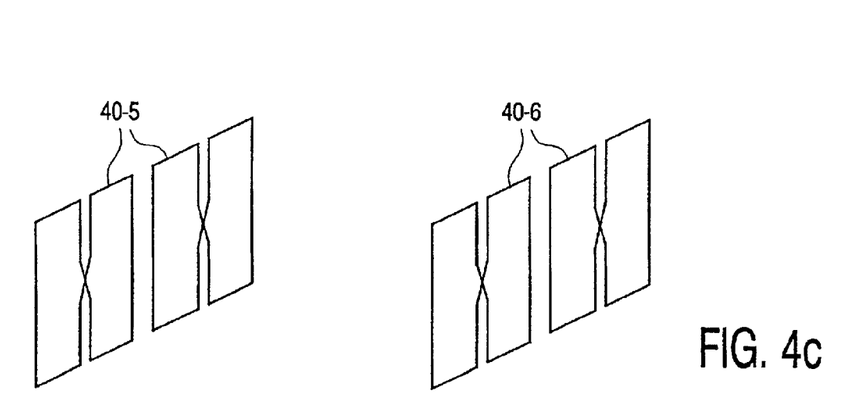

FIGS. 4a, 4b and 4c also show embodiments that combine 4 butterfly coil elements so as to form 2 channel quadrature coil arrangements for a reduction factor of 2 in SENSE. Alternatively, each of the 4 linear elements can be otherwise distributed so as to provide 4 channel linear coil arrangements that allow a reduction factor of 2 in SENSE along two orthogonal spatial axes, thereby enabling a total SENSE reduction factor of 4. In the case of the embodiment of FIG. 4a, the coils 40-1 and 40-2 are most sensitive to the x-component of transverse magnetization (RF field). In the case of the embodiment of FIG. 4b, the coils 40-3 and 40-4 are most sensitive to the y-component of transverse magnetization. In the case of the embodiment of FIG. 4c the coils 40-5 and 40-6 are again most sensitive to the y-component of transverse magnetization. It is also possible to combine the various embodiments of the FIGS. 2a, 2b and 2c so as to obtain a corresponding reduction factor of 2 in SENSE along two orthogonal spatial axes, thereby enabling a total SENSE reduction factor of 4.

Figure 5:
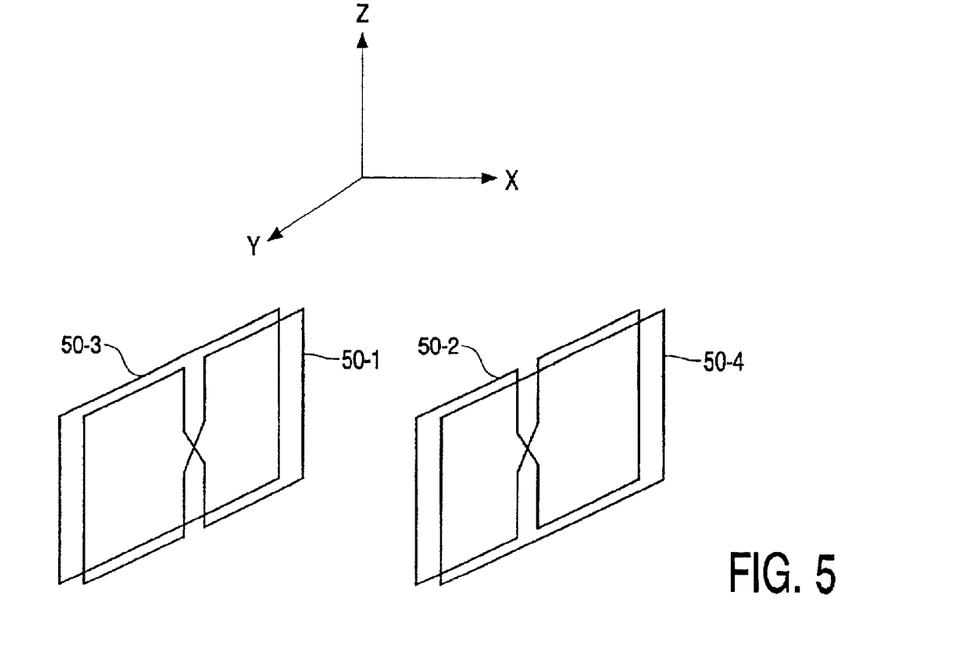
FIG. 5 shows a coil arrangement according to another embodiment of the invention which consists of butterfly coils and single coils.

FIG. 5 shows an embodiment that combines two butterfly coils 50-1 and 50-2 with two single coils 50-3 and 50-4. Just like the embodiments of the FIGS. 3 and 4, a combination of 4 linear elements forms a 2-channel quadrature coil arrangement so as to obtain a reduction factor of 2 in SENSE. The butterfly coils 50-1 and 50-2 are most sensitive to the y-component of transverse magnetization (RF field) whereas the single coils 50-3 and 50-4 are most sensitive to the x-component of the RF field.

Figure 6:
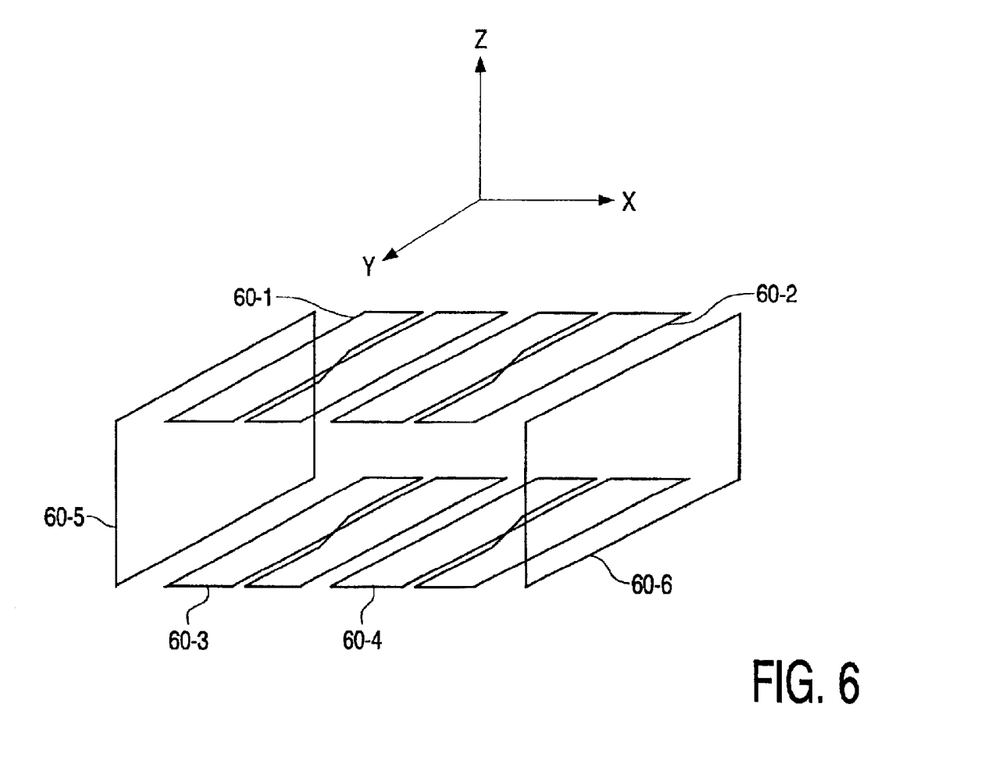
FIG. 6 shows another coil arrangement according to invention which consists of butterfly coils and single coils.
Figure 7:
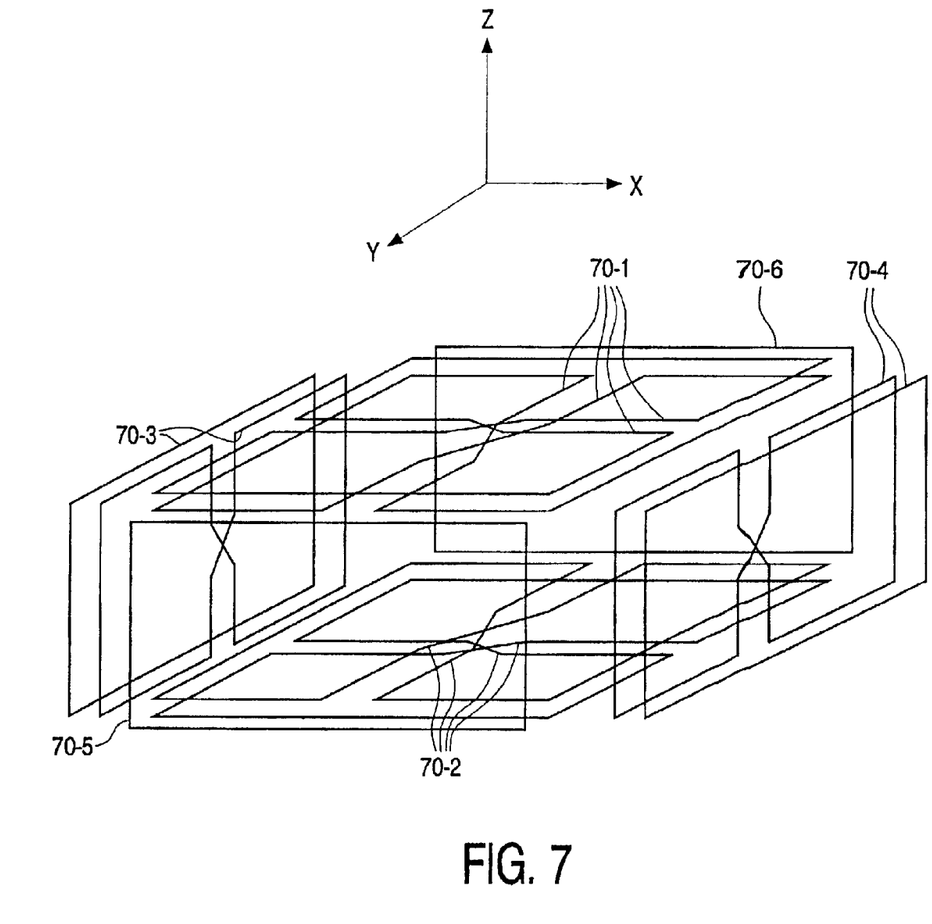
FIG. 7 shows another coil arrangement according to invention which consists of more butterfly coils and more single coils.

FIGS. 6 and 7 show further embodiments that utilize even more channels and combinations of linear and quadrature coil elements, offering even higher reduction factors for SENSE applications as well as extended spatial coverage.

In FIG. 6 the arrangement of FIG. 4a (coils 60-1, 60-2, 60-3 and 60-4) is combined with two single coils 60-5 and 60-6. The butterfly coils are most sensitive to the x-component of the RF field and so are the single coils 50-3 and 50-4.

In FIG. 7 the arrangement of FIG. 3 (coils 70-1 and 70-2) is combined with the arrangement of FIG. 5 (coils 70-3 and 70-4) as well as with two single coils 70-5 and 70-6. The butterfly coils 70-1 and 70-2 are most sensitive to the x-component and to the y-component of the RF field; the butterfly coils in the coil sets 70-3 and 70-4 are most sensitive to the y-component of the RF field. The single coils in the coil sets 70-3 and 70-4 are most sensitive to the x-component of the RF field. The single coils 70-5 and 70-6 are most sensitive to the y-component of the RF field.

It is to be noted that individual coil elements in the SENSE application are not required to overlap physically; this is in contrast with the case of the well known phased array coils. Though the coil elements in the various Figures are depicted as square or rectangular rigid coils, they may also have a circular or other non-square shape and be flexible. The butterfly elements can only be substituted by coils that exhibit similar properties of sensitivity with respect to magnetization components parallel to the plane of the coil. In the case where simple loop (single loop) and butterfly elements overlap so as to form a quadrature element, it is to be understood that this can also be substituted with a single quadrature coil element that is sensitive to both components of the transverse magnetization. In the case where two butterfly elements overlap with a 90 degree rotation so as to form a quadrature element, it is to be understood that this can also be substituted by a single quadrature coil element that is sensitive to both components of the transverse magnetization. The coils as shown in the various Figures coils can be used both for RF transmission and reception.

What is claimed is:

1. A method for obtaining MRI images of an object (8) to be examined in an imaging volume of an MRI apparatus, the object having a longitudinal axis in the y-direction, in which method:

a homogeneous magnetic field is provided in the z-direction in the imaging volume of the apparatus, the object to be examined (8) is positioned in the imaging volume such that its longitudinal axis extends transversely of the z-direction, an RF excitation pulse is generated in the imaging volume of the apparatus, magnetic resonance signals which are due to the RF excitation pulse are acquired by means of at least one RF receiving coil, characterized in that the magnetic resonance signals which are due to the RF excitation pulse are acquired in a sub-sampled fashion by means of a set of at least two RF receiving coils (20), a magnetic resonance image is derived from the sub-sampled magnetic resonance signals and on the basis of previously determined spatial coil sensitivity profiles of each RF coil in the set of RF receiving coils (20), said spatial coil sensitivity profiles being mutually independent, and the planes of the at least two receiving coils extend substantially parallel to one another and to the z-direction.

2. A method as claimed in claim 1, wherein the receiving coils are embodied as butterfly coils.

3. A method as claimed in claim 2, wherein the butterfly coils are sensitive to an RF field component transversely of the z-direction.

4. A method as claimed in claim 3, wherein two single coils (50-3, 50-4) are provided such that a first one and a second one of the single coils is arranged concentrically with a first one and a second one of the butterfly coils (50-1, 50-2), respectively, which first coils are situated in the same coil plane and so are the second coils.

5. A method as claimed in claim 3, wherein two further butterfly coils (40-1, 40-2) are provided such that each time two butterfly coils are situated adjacently in the same coil plane and all coils are sensitive to the same RF field component.

6. A method as claimed in claim 4, wherein two single coils (60-5, 60-6) having mutually parallel coil planes are arranged in such a way that their coil planes extend transversely of the planes of the butterfly coils (60-1, 60-2, 60-3, 60-4).

7. A method as claimed in claim 3, wherein two further butterfly coils (30-2, 30-4) are provided such that each time one further butterfly coil (30-2) is concentrically arranged relative to one butterfly coil (30-1) of said set of at least two RF receiving coils, the one further butterfly coil and the one butterfly coil of said set of at least two RF receiving coils being situated in the same coil plane and said further butterfly coils being sensitive to an RF field component transversely of the RF field component whereto the butterfly coils of said set are sensitive.

8. A method as claimed in claim 7, wherein: there is provided a first set of single coils (70-7, 70-8) which have mutually parallel coil planes and are arranged in such a way that their coil planes extend transversely of the planes of the butterfly coils (70-1, 70-2), there is provided a second set of single coils (70-5, 70-6) which have mutually parallel coil planes and are arranged in such a way that their coil planes extend transversely of the planes of the butterfly coils (70-1, 70-2) as well as transversely of the planes of the first set of single coils (70-7, 70-8), and there is provided a further set of butterfly coils (70-3, 70-4) such that each time one further butterfly coil (70-3, 70-4) is arranged concentrically with one single coil (70-8, 70-7) of said first set, which coils are situated in the same coil plane.

9. An MRI apparatus for obtaining MRI images of an object to be examined in an imaging volume of the MRI apparatus, the object having a longitudinal axis in the y-direction, said apparatus comprising:

magnet poles for creating a homogeneous magnetic field that is provided in the z-direction in the imaging volume of the apparatus, the object to be examined being positioned in the imaging volume such that its longitudinal axis extends transversely of the z-direction, and a set of at least two RF coils for generating an RF excitation pulse in the imaging volume of the apparatus, and for acquiring magnetic resonance signals which are due to the RF excitation pulse, wherein the magnetic resonance signals which are due to the RF excitation pulse are acquired in a sub-sampled fashion by means of said set, a magnetic resonance image is derived from the sub-sampled magnetic resonance signals and on the basis of previously determined spatial coil sensitivity profiles of each RF coil in said set, said spatial coil sensitivity profiles being mutually independent, and the planes of the at least two of said coils extend substantially parallel to one another and to the z-direction.

10. The apparatus as claimed in claim 9, wherein the coils are embodied as butterfly coils.

11. The apparatus as claimed in claim 10, wherein the butterfly coils are sensitive to an RF field component transversely of the z-direction.

12. The apparatus as claimed in claim 11, comprising two further butterfly coils such that each time one further butterfly coil is concentrically arranged relative to one butterfly coil of said set of at least two RF coils, the one further butterfly coil and the one butterfly coil of said set of at least two RF coils being situated in the same coil plane and said further butterfly coils being sensitive to an RF field component transversely of the RF field component whereto the butterfly coils of said set are sensitive.

13. The apparatus as claimed in claim 11, comprising two further butterfly coils such that each time two butterfly coils are situated adjacently in the same coil plane and all coils are sensitive to the same RF field component.

14. The apparatus as claimed in claim 13, wherein two single coils having mutually parallel coil planes are arranged in such a way that their coil planes extend transversely of the planes of the butterfly coils.

15. The apparatus as claimed in claim 13, wherein: there is provided a first set of single coils which have mutually parallel coil planes and are arranged in such a way that their coil planes extend transversely of the planes of the butterfly coils, there is provided a second set of single coils which have mutually parallel coil planes and are arranged in such a way that their coil planes extend transversely of the planes of the butterfly coils as well as transversely of the planes of the first set of single coils, and there is provided a further set of butterfly coils such that each time one further butterfly coil is arranged concentrically with one single coil of said first set, which coils are situated in the same coil plane.

16. The apparatus as claimed in claim 11, wherein two single coils are provided such that a first one and a second one of the single coils is arranged concentrically with a first one and a second one of the butterfly coils, respectively, which first coils are situated in the same coil plane and so are the second coils.

* * * * *